United States Patent
Cheng et al.

(10) Patent No.: US 7,537,049 B2
(45) Date of Patent: May 26, 2009

(54) HEAT DISSIPATION APPARATUS

(75) Inventors: Nien-Tien Cheng, Tu-Cheng (TW); Chen-Shen Lin, Tu-Cheng (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/309,817

(22) Filed: Oct. 3, 2006

(65) Prior Publication Data

US 2007/0251676 A1 Nov. 1, 2007

(30) Foreign Application Priority Data

Apr. 28, 2006 (CN) .......................... 200610060532

(51) Int. Cl.
*F28D 15/02* (2006.01)
*F28F 7/02* (2006.01)
*H05K 7/20* (2006.01)

(52) U.S. Cl. ................ 165/104.33; 165/80.3; 165/80.4; 165/104.21; 361/700

(58) Field of Classification Search ....... 165/80.3–80.5, 165/104.21, 104.33; 361/700; 257/715
See application file for complete search history.

(56) References Cited

U.S. PATENT DOCUMENTS

| | | | |
|---|---|---|---|
| 6,166,906 A * | 12/2000 | Sun et al. ..................... | 361/697 |
| 6,328,097 B1 * | 12/2001 | Bookhardt et al. ..... | 165/104.33 |
| 6,373,700 B1 * | 4/2002 | Wang .......................... | 361/698 |
| 6,504,720 B2 * | 1/2003 | Furuya ........................ | 361/699 |
| 6,587,343 B2 * | 7/2003 | Novotny et al. ............. | 361/698 |
| 6,650,540 B2 * | 11/2003 | Ishikawa ..................... | 361/695 |
| 2004/0001316 A1 * | 1/2004 | Kamikawa et al. .......... | 361/700 |
| 2004/0042184 A1 * | 3/2004 | Tomioka ..................... | 361/752 |
| 2004/0228093 A1 * | 11/2004 | Lee ............................. | 361/701 |
| 2005/0022969 A1 * | 2/2005 | Chen et al. .................. | 165/80.3 |
| 2005/0252642 A1 * | 11/2005 | Chang ........................ | 165/80.3 |
| 2007/0006992 A1 * | 1/2007 | Liu et al. ............... | 165/104.26 |

FOREIGN PATENT DOCUMENTS

| | | |
|---|---|---|
| CN | 2403062 Y | 10/2000 |
| CN | 1536657 A | 10/2004 |
| TW | M247899 | 10/2004 |

* cited by examiner

*Primary Examiner*—Teresa J Walberg
(74) *Attorney, Agent, or Firm*—Frank R. Niranjan

(57) ABSTRACT

A heat dissipation apparatus (10) includes a computer enclosure (110) made of thermally conductive material, a fin assembly (140) secured to the computer enclosure, and a heat pipe (130) having an evaporating section (131) thermally connecting with a heat generating electronic component and a condensing section (132) thermally connecting with the fin assembly. The fin assembly has a bottom surface contacting with a chassis of the enclosure to thereby transfer heat from the fin assembly to the chassis for dissipation. The enclosure forms a pair of clamping members (111) clamping the fin assembly therebetween.

3 Claims, 5 Drawing Sheets ies. The components in the drawings are not necessarily drawn to scale, the emphasis instead being placed upon clearly illustrating the principles of the present heat dissipation apparatus. Moreover, in the drawings, like reference numerals designate corresponding parts throughout the several views.

FIG. 1 is an exploded, isometric view of a heat dissipation apparatus in accordance with a first preferred embodiment of the present invention;

FIG. 2 is an assembled, isometric view of the heat dissipation apparatus of FIG. 1;

FIG. 3 is an isometric view of a fin assembly of the heat dissipation apparatus of FIG. 1, viewed in an upside-down aspect;

FIG. 4 is an exploded, isometric view of a heat dissipation apparatus in accordance with a second preferred embodiment of the present invention; and FIG. 5 is an assembled, isometric view of the heat dissipation apparatus of FIG. 4.

HEAT DISSIPATION APPARATUS

FIELD OF THE INVENTION

The present invention relates generally to a heat dissipation apparatus, and more particularly to a heat dissipation apparatus for dissipating heat generated by heat generating electronic components enclosed in a system enclosure, wherein the apparatus has a fin assembly secured to the enclosure for dissipating heat via the enclosure.

DESCRIPTION OF RELATED ART

It is well known that heat is produced by electronic components such as integrated circuit chips during their normal operations. If the heat is not timely removed, these electronic components may overheat. Therefore, heat dissipation apparatuses are often used to cool these electronic components.

As an example, a conventional heat dissipation apparatus generally includes a plate, a fin assembly having a plurality of fins, a fan creating an airflow over the fin assembly, and a heat pipe having an evaporating section being maintained in thermal contact with a heat generating electronic component such as a central processing unit (CPU) of a computer, and a condensing section to which the fin assembly is attached. The fin assembly and the fan are disposed on the plate, and then the plate together with the fin assembly and the fan is secured to an enclosure of the computer. The heat pipe transfers heat from the heat generating electronic component which is thermally connected with the evaporating section thereof, to the fin assembly which is attached to the condensing section of the heat pipe. The heat is then dissipated into the ambient atmosphere via the airflow flowing over the fin assembly.

However, the heat dissipation apparatus dissipates the heat only by making use of the fin assembly. Thus, the heat dissipation surface area is relatively small and the heat dissipation efficiency of the heat dissipation apparatus is accordingly not satisfactory.

Therefore, it is desirable to provide a heat dissipation apparatus which can overcome the above-mentioned disadvantage.

SUMMARY OF THE INVENTION

The present invention relates to a heat dissipation apparatus for dissipating heat generated by a heat generating electronic component. According to a preferred embodiment of the present invention, the heat dissipation apparatus includes a computer enclosure made of thermally conductive material, a fin assembly secured to the computer enclosure, and a heat pipe having an evaporating section thermally connecting with the heat generating electronic component and a condensing section thermally connecting with the fin assembly. The fin assembly has a bottom surface contacting with a chassis of the enclosure to thereby transfer heat from the fin assembly to the chassis for dissipation via the enclosure. The heat dissipation surface area is thus increased and as a result, the heat dissipation efficiency of the heat dissipation apparatus is improved.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present heat dissipation apparatus can be better understood with reference to the following draw-

DETAILED DESCRIPTION OF THE INVENTION

Figure 1:
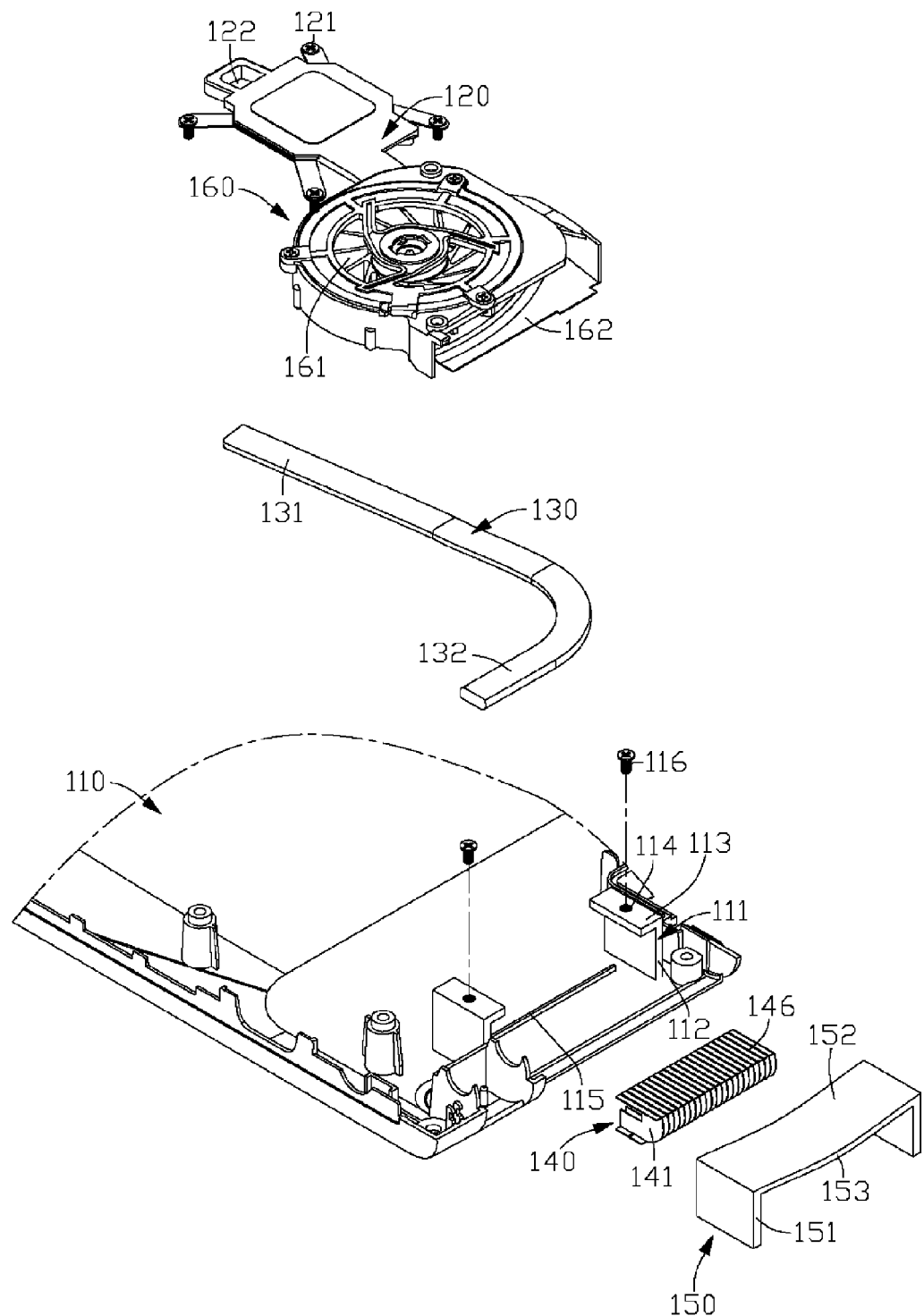
Figure 2:
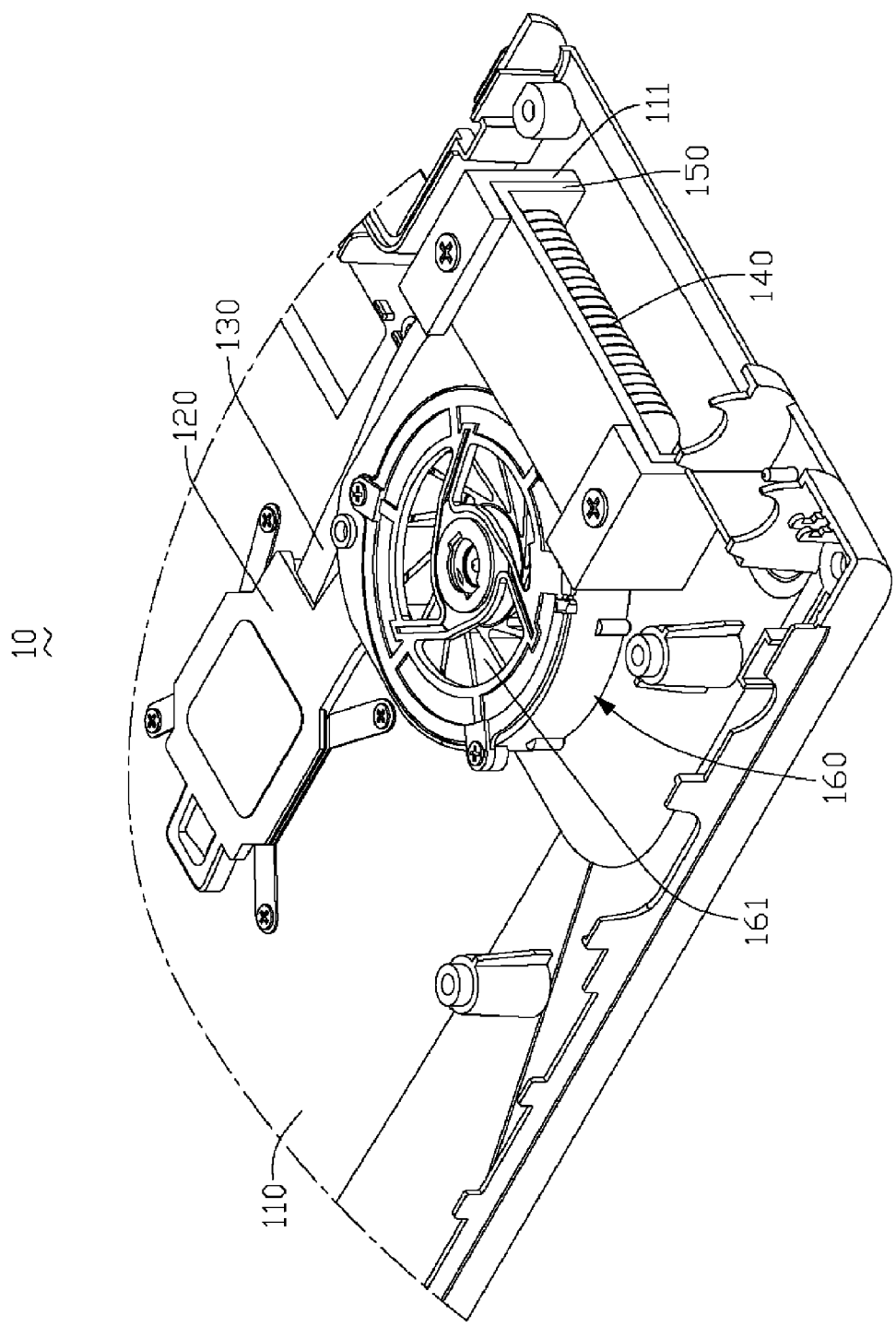

Referring to FIGS. 1-2, a heat dissipation apparatus 10 according to a first preferred embodiment of the present invention is shown. The heat dissipation apparatus 10, which is attached to a chassis of a computer enclosure 110 having good heat conduction, includes a heat pipe 130, a heat spreader 120 for thermally connecting with a heat generating electronic component (not labeled) in the computer enclosure 110, a fin assembly 140 attached to the computer enclosure 110, a fixing member 150, and a centrifugal blower 160 for producing an airflow flowing over the fin assembly 140.

The computer enclosure 110 is typically made of a highly thermally conductive material such as zinc, aluminum, magnesium or their alloys. The computer enclosure 110 is formed by die casting. A pair of spaced clamping members 111 are integrally formed with the computer enclosure 110 during the die casting. Each of the clamping members 111 is substantially L-shaped and includes a vertical plate 112 extending vertically upwardly from the enclosure 110 and a horizontal plate 113 extending perpendicularly from a top of the vertical plate 112 towards the other clamping member 111. The horizontal plate 113 defines a threaded hole 114 therein for receiving a screw 116 therethrough to secure the fin assembly 140 to the computer enclosure 110. A strip 115, which projects above the enclosure 110, is integrally formed with the enclosure and is located between the pair of clamping members 111. The strip 115 is perpendicular to and spaced a distance from the vertical plates 112 of the clamping members 111.

The fixing member 150 and the clamping members 111 are cooperatively used to secure the fin assembly 140 to the enclosure 110. The fixing member 150, which has a substantially U-shaped cross section, includes a spring top wall 152 and two sidewalls 151 descending from the top wall 152. The top wall 152 sinks downwardly at a middle thereof to form a pressing portion 153. Accordingly, the top wall 152 has two spring portions (not labeled) extending outwardly and slightly upwardly from the pressing portion 153 in opposite directions, whereby the top wall 152 has a V-shaped profile.

The heat spreader 120, which is secured to the computer enclosure 110 via a plurality of screws 121, thermally connects with the heat generating electronic component in the computer enclosure 110 and defines a groove 122 therein for receiving the heat pipe 130 in the groove 122.

The heat pipe 130, which is flattened so as to increase the surface area contacting with the fin assembly 140, has an evaporating section 131 for being received in the groove 122 of the heat spreader 120 so as to thermally connect with the heat generating electronic component, and a condensing section 132 for being thermally attached to the fin assembly 140.

The centrifugal blower 160, which is located at a lateral side of the heat spreader 120 and is secured to the enclosure 110 via fasteners such as screws (not shown), has an air inlet 161 at a top surface thereof, and an air outlet 162 at a lateral side thereof, wherein the airflow produced by the centrifugal blower 160 flows from the air inlet 161 towards the air outlet 162. The fin assembly 140 is disposed at the air outlet 162 of the centrifugal blower 160. The airflow coming to the air outlet 162 of the centrifugal blower 160 then flows over the fin assembly 140 to dissipate heat from the fin assembly 140 into ambient atmosphere.

Figure 3:
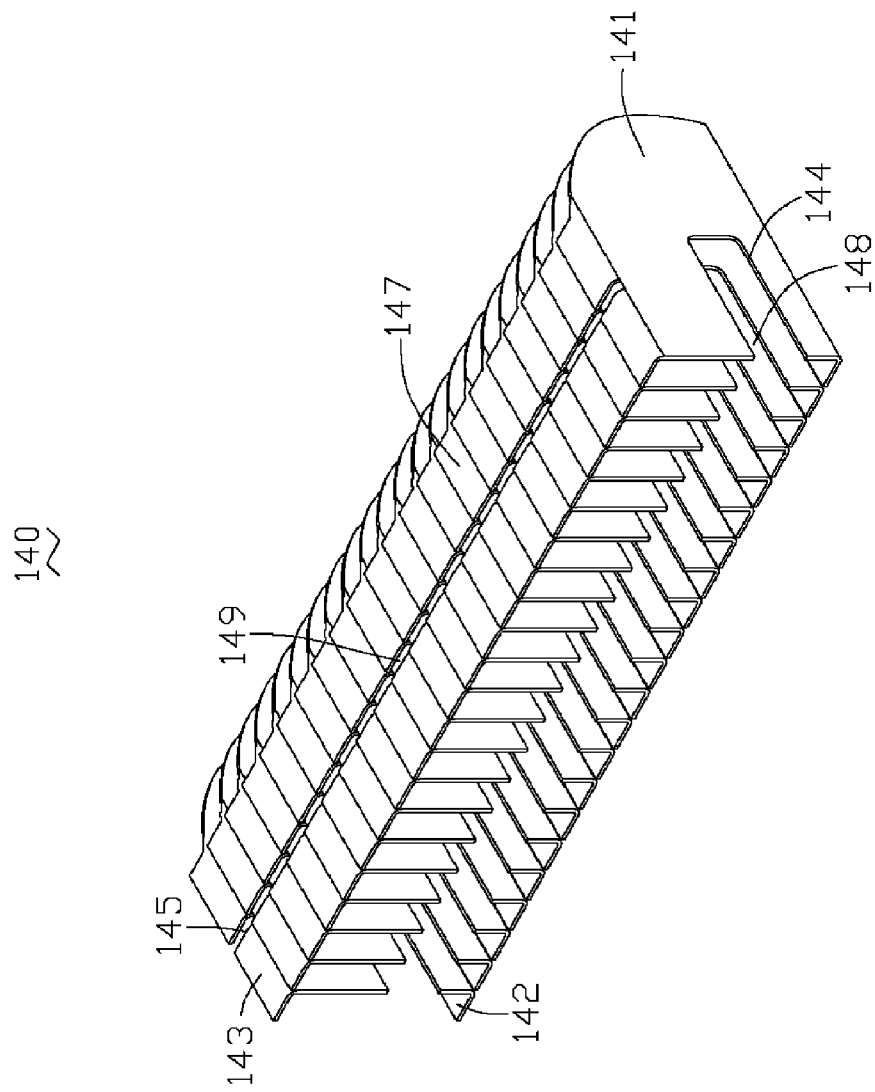

Referring to FIG. 3, the fin assembly 140 includes a plurality of fins 141 each having two flanges 142,143 formed respectively at top and bottom ends thereof, and defining a cutout 144 at an upper portion thereof. A slot 145 is defined at a middle of the bottom flange 143 of each fin 141. When the fins 141 are assembled, a top surface 146 (as shown in FIG. 1) and a bottom surface 147 are formed via the combination of the top flanges 142 and the combination of the bottom flanges 143, respectively. Similarly, a first elongated channel 148 is formed via the combination of the cutouts 144 of the fins 141 for receiving the condensing section 132 of the heat pipe 130 therein. A second elongated channel 149 is formed via the combination of the slots 145 on the bottom flanges 143 of the fins 141 for receiving the strip 115 of the computer enclosure 110. Alternatively, the first channel 148 can be defined at the bottom end of the fin assembly 140, so that the condensing section 132 of the heat pipe 130, when received in the channel 148 of the fin assembly 140, simultaneously contacts with the fin assembly 140 and the computer enclosure 110.

In the present heat dissipation apparatus 10, the fin assembly 140 is attached to the chassis of the computer enclosure 110 so that the bottom surface 147 of the fin assembly 140 contacts directly with the chassis. In securing the fin assembly 140 to the computer enclosure 110, the fin assembly 140 firstly is placed between the two clamping members 111, with the bottom surface 147 attached to the enclosure 110 and the second channel 149 of the fin assembly 140 receiving the strip 115 of the enclosure 110 therein, for restricting movement of the fin assembly 140 along the chassis of the enclosure 110. The fixing member 150 is then disposed between the two clamping members 111 and the fin assembly 140, with the top wall 152 of the fixing member 150 located under the horizontal plates 113 of the clamping members 111 and the pressing portion 153 of the top wall 152 abutting against the top surface 146 of the fin assembly 140. The screws 116 extend through the threaded holes 114 of the clamping members 111 to abut downwardly against the spring portions of the top plate 152 so as to secure the fin assembly 140 to the computer enclosure 110. Preferably, a layer of thermal interface material (not shown), such as thermal grease, is arranged at the contacting surfaces between the bottom surface 147 of the fin assembly 140 and the chassis of the computer enclosure 110, for improving the heat conduction efficiency therebetween.

In the present heat dissipation apparatus 10, the fin assembly 140 is secured to the computer enclosure 110 via the clamping members 111 and the fixing member 150. The heat pipe 130 transfers heat generated by the heat generating electronic component from the heat spreader 120 thermally connecting with the heat generating electronic component to the fin assembly 140 and then to the computer enclosure 110. In that way, a part of the heat is dissipated into ambient atmosphere via the fin assembly 140, and another part of the heat is transferred from the fin assembly 140 to the computer enclosure 110 and is dissipated via the computer enclosure 110. Accordingly, the heat dissipation surface area now available is increased and the heat dissipation efficiency of the heat dissipation apparatus 10 is improved. Furthermore, since the present heat dissipation apparatus 10 is directly attached to the enclosure 110, vibration and accordingly noise caused by the fan 160 during operation of the heat dissipation apparatus 10 can be lowered.

Figure 4:
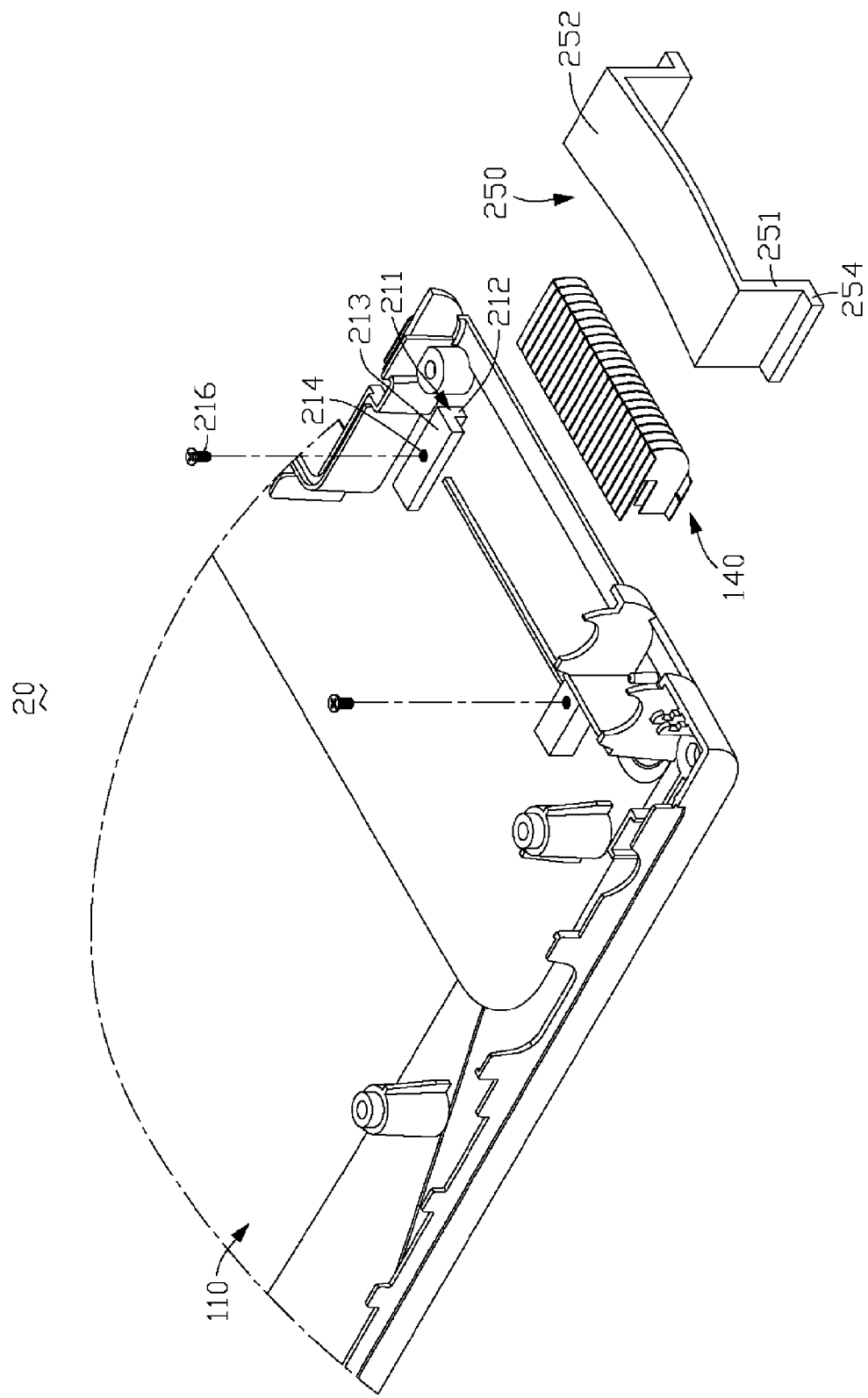
Figure 5:
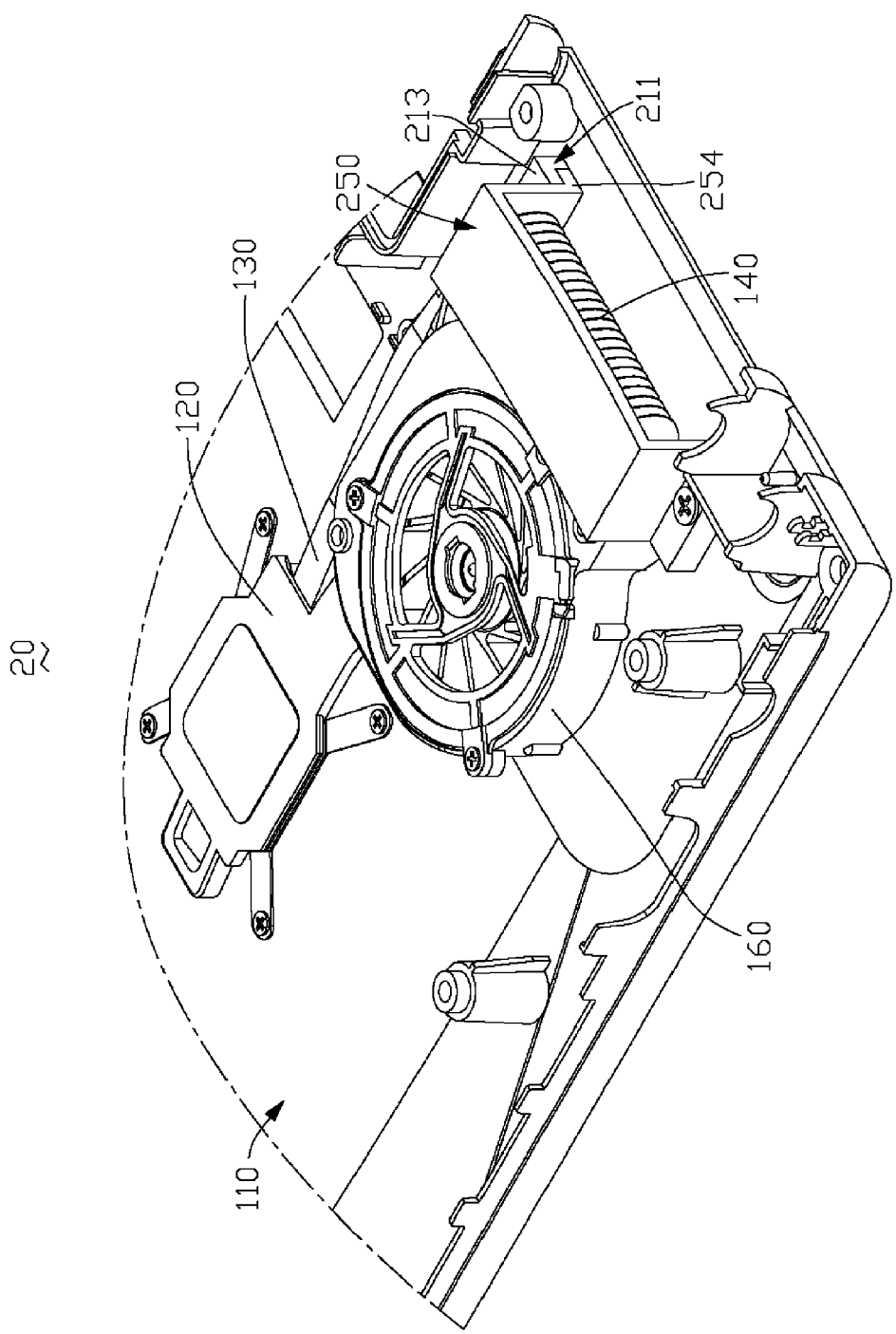

Referring to FIGS. 4-5, a heat dissipation apparatus 20 according to a second embodiment of the present invention is shown. In this embodiment, the fixing member 250 of the heat dissipation apparatus 20 further includes two bottom walls 254 outwardly horizontally extending from free ends of the two sidewalls 251, respectively. A spacing between the two clamping members 211 on the computer enclosure 110 is larger than a spacing between the two clamping members 111 in the first embodiment. A height of the vertical plate 212 of each of the clamping members 211 is relatively smaller than that of the vertical plate 112 shown in the first embodiment. Each of the bottom walls 254 of the clamping members 250 is received in a space (not labeled) formed between the horizontal plate 213 of the corresponding clamping member 211 and the chassis of the enclosure 110, with the bottom wall 254 simultaneously contacting with the horizontal plate 213 and the enclosure 110. The screw 216 extends through the threaded hole 214 of the clamping member 211 to abut downwardly against the bottom wall 254 of the fixing member 250 so as to secure the fin assembly 140 to the computer enclosure 110. Alternatively, the clamping members 211 can be advantageously omitted, the screw 216 extends through a hole (not shown) defined in each of the bottom walls 254 and engages with the computer enclosure 110, so as to secure the fin assembly 140 to the computer enclosure 110.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation apparatus comprising:
   a system enclosure of a computer made of thermally conductive material;
   a fin assembly secured to a chassis of the system enclosure, the fin assembly including a plurality of fins each having a flange, the flanges of the fins cooperatively forming a bottom surface and contacting with the chassis of the system enclosure; and
   a heat pipe having an evaporating section adapted for thermally connecting with a heat generating electronic component enclosed in the system enclosure and a condensing section thermally connecting with the fin assembly;
   wherein a strip projects above and is monolithic with the chassis of the system enclosure, and the fin assembly defines an elongated channel at the bottom surface thereof for receiving the strip.

2. A heat dissipation apparatus for an electronic device, comprising:
   a chassis of a system enclosure of a computer in which an electronic component is enclosed;
   a fin assembly secured to the chassis, including a plurality of fins each having a flange formed at a bottom end thereof, the flanges of the fins cooperatively forming a bottom surface, wherein the bottom surface physically contacts with the chassis of the system enclosure;

a blower secured to the chassis and in the system enclosure and generating an airflow flowing through the fin assembly;

a heat pipe having one end for thermally connecting with the electronic component and another end extending through the fins of the fin assembly; and a pair of clamping members fixed to the chassis and located at opposite sides of the fin assembly, wherein the fin assembly is secured to the chassis by the clamping members, and the system enclosure is made of thermally conductive material;

wherein a strip projects above and is monolithic with the chassis, the strip being located between the pair of clamping members, and the fin assembly defines an elongated channel at the bottom surface thereof for receiving the strip.

3. The heat dissipation apparatus of claim 2, wherein each of the clamping members has an inverted, substantially L-shaped profile, and a fixing member is further provided and sandwiched between the clamping members and the fin assembly, wherein the fixing member has a substantially V-shaped top wall pressing the fin assembly downwardly against the chassis to which the fin assembly is secured.

* * * * *